(12) United States Patent
Krischke et al.

(10) Patent No.: US 9,735,264 B2
(45) Date of Patent: Aug. 15, 2017

(54) SEMICONDUCTOR SWITCH WITH INTEGRATED TEMPERATURE SENSOR

(71) Applicant: Infineon Technologies AG, Neubiberg (DE)

(72) Inventors: Norbert Krischke, Munich (DE); Bernhard Auer, Millstatt (AT); Robert Illing, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/840,925

(22) Filed: Aug. 31, 2015

(65) Prior Publication Data

US 2016/0071972 A1    Mar. 10, 2016

(30) Foreign Application Priority Data

Sep. 5, 2014   (DE) .......................... 10 2014 112 823

(51) Int. Cl.
*H01L 29/66* (2006.01)
*H01L 29/78* (2006.01)
*H01L 29/40* (2006.01)

(52) U.S. Cl.
CPC ........ *H01L 29/7803* (2013.01); *H01L 29/407* (2013.01); *H01L 29/7813* (2013.01); *H01L 29/7815* (2013.01)

(58) Field of Classification Search
None
See application file for complete search history.

(56) References Cited

U.S. PATENT DOCUMENTS

| | | | | |
|---|---|---|---|---|
| 5,363,550 A | * | 11/1994 | Aitken | ...................... H01P 3/06 29/828 |
| 2007/0215920 A1 | * | 9/2007 | Zundel | .................. H01L 21/743 257/288 |
| 2009/0195176 A1 | * | 8/2009 | Suzuki | ............... H05B 41/2887 315/277 |

* cited by examiner

*Primary Examiner* — Calvin Choi
(74) *Attorney, Agent, or Firm* — Murphy, Bilak & Homiller, PLLC (57) ABSTRACT

A semiconductor device includes a semiconductor body, at least one wiring layer disposed on the semiconductor body and a field effect transistor integrated in the semiconductor body. The field effect transistor has a plurality of gate electrodes residing in corresponding gate trenches formed in the semiconductor body. A first circuit is integrated in the semiconductor body adjacent to the field effect transistor, and a second circuit is integrated in the semiconductor body remote from the first circuit. A first additional trench is formed in the semiconductor body and includes at least one connecting line which electrically connects the first circuit and the second circuit. The semiconductor device also includes at least one conductive pad formed in the at least one wiring layer. The at least one conductive pad is arranged to at least partially cover the first additional trench to form a shielding of the at least one connecting line.

19 Claims, 6 Drawing Sheets

Fig. 8 (section A-A')

SEMICONDUCTOR SWITCH WITH INTEGRATED TEMPERATURE SENSOR

PRIORITY CLAIM

This application claims priority to German Patent Application No. 10 2014 112 823.0 filed on 5 Sep. 2014, the content of said application incorporated herein by reference in its entirety.

TECHNICAL FIELD

The present disclosure relates to the field of power semiconductor switches with an integrated temperature sensor.

BACKGROUND

Power transistors such as power MOS field effect transistors (MOSFETs), insulated gate bipolar transistors (IGBTs) or the like are often implemented as so-called vertical transistors. The term "vertical" refers to the direction of load current flow through the semiconductor die, which is vertically with respect to a top surface of the semiconductor die. Furthermore, such power transistors are usually composed of a plurality of transistor cells and, for each cell, the gate electrode is arranged in a so-called "trench", which extends from the top surface vertically into the semiconductor die. This class of power transistors is usually referred to as "trench transistors".

The semiconductor die (chip), in which a trench transistor is integrated, may include further circuitry to provide further functions besides its main function of being an electronic switch. For example, the chip may further include a temperature sensor and respective sense circuitry to measure the temperature of the transistor and to generate a temperature signal (i.e. a current or a voltage signal representing the temperature present at the location of the temperature sensor). The temperature signal may be used, for example, in an over-temperature or an overload protection circuit, which may be needed in order to protect the transistor against thermal breakdown. Further circuitry may be included in the chip to provide other functions such as current sensing, over-current protection, a digital bus interface (e.g. Serial Peripheral Interface, SPI) etc.

Common manufacturing technologies allow two wiring layers arranged on top of the semiconductor body, wherein the first wiring layer is usually formed by polycrystalline silicon and the second wiring layer is usually formed by a metal (e.g. aluminum). The two wiring layers are used to interconnect the individual circuit components integrated in the semiconductor die to form the desired electronic circuit. On top of the wiring layers (and isolated therefrom) a further metal layer is provided, which is comparably thick and sometimes referred to as "power metal layer". This metal layer is used as contact layer (also acting as bond pad) to contact an external load terminal (e.g. source or collector terminal of the power transistor) with the chip.

The mentioned temperature sensors are usually arranged close to or within (e.g. in the center of) an array of transistor cells, which compose the power transistor, and usually the temperature sense circuit is connected to the respective sense circuit via strip lines (sense lines) formed the mentioned wiring layers on top of the semiconductor body. As the sense circuit may be formed in the semiconductor chip aside from the array of transistor cells the strip lines between sense circuit and temperature sensor may be comparably long, e.g. 300 µm or even more.

As the (patterned) wiring layers and the top metal layer forming the contact layer for an external load terminal are substantial parallel (coplanar) and separated by comparably thin insulation layers, a significant capacitive coupling occurs, particularly between the contact layer and the subjacent wiring layer. This capacitive coupling (due to parasitic capacitances between the wiring layers and the contact layer) results in a significant sensitivity to "direct power injection" (DPI). Particularly, when the power transistor is an n-channel device operated as high-side switch the electric potential (and thus the voltage) of the (power) contact layer will (during a switching operation) rapidly change from zero (ground potential) to approximately the upper supply potential and vice versa. This will cause displacement currents in the sense lines and have a negative impact on the temperature sensing as displacement currents may result in distortions of the temperature signal.

In view of the above, there is a need for an improved semiconductor switch with an integrated temperature sensor.

SUMMARY

A semiconductor device is described herein. In accordance with one example of the invention the semiconductor device includes a semiconductor body, at least one wiring layer disposed on the semiconductor body, and a field effect transistor integrated in the semiconductor body. The field effect transistor has a plurality of gate electrodes residing in corresponding gate trenches, which are formed in the semiconductor body. The semiconductor device further includes a temperature sensor integrated in the semiconductor body adjacent to the field effect transistor. A temperature sense circuit is integrated in the semiconductor body remote from the temperature sensor, and at least one additional trench is formed in the semiconductor body. The at least one additional trench includes at least one sense line, which electrically connects the temperature sensor and the temperature sense circuit. At least one conductive pad is formed in the at least one wiring layer, and the at least one conductive pad is arranged to at least partially cover the at least one additional trench to form a shielding of the sense line(s).

In accordance with another example of the invention, the semiconductor device includes a semiconductor body, at least one wiring layer disposed on the semiconductor body, and a field effect transistor integrated in the semiconductor body. The field effect transistor has a plurality of gate electrodes residing in corresponding gate trenches formed in the semiconductor body. A first circuit is integrated in the semiconductor body adjacent to the field effect transistor, and a second circuit integrated in the semiconductor body remote from the first circuit. At least a first additional trench is formed in the semiconductor body, wherein the first additional trench includes at least one connecting line, which electrically connects the first circuit and the second circuit. Furthermore, the semiconductor device includes at least one conductive pad formed in the at least one wiring layer. The at least one conductive pad is arranged to at least partially cover the first additional trench to form a shielding of the connecting line(s).

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
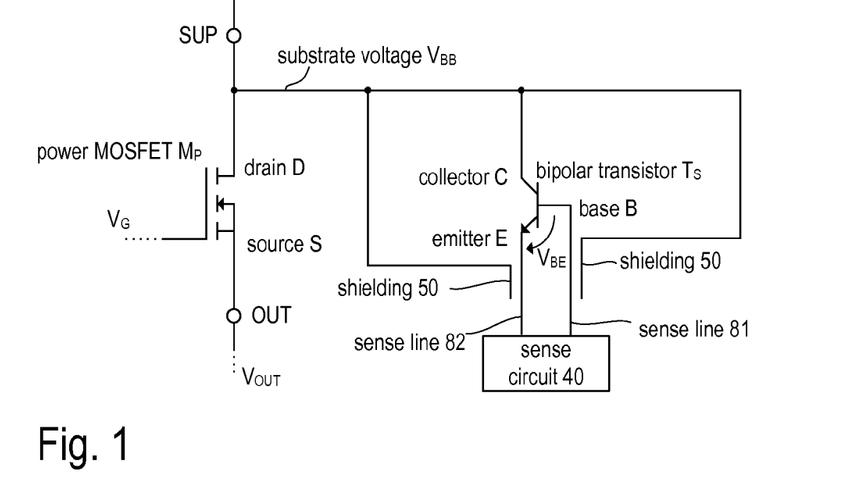
FIG. 1 is a circuit diagram illustrating the power transistor and a bipolar transistor, which is used as temperature sensor.

FIG. 1 is a circuit diagram illustrating—on a circuit level—one example of a power transistor including a temperature sensor. In the present example, a MOSFET is used as power transistor. However, other types of transistors (e.g. an IGBT) may be used instead. The semiconductor chip has (amongst other electric terminals) two load terminals which are labelled SUP and OUT in the present example. The two load terminals SUP and OUT are coupled via the load current path (i.e. the drain-source current path in case of a MOSFET) of the power transistor $M_P$, wherein the drain electrode D of the transistor $M_P$ is connected to the first load terminal SUP and the source electrode S of the transistor $M_P$ is connected to the second load terminal OUT. In the present example, the transistor $M_P$ is an n-channel transistor, which is operated as a high-side switch and, therefore, a supply voltage $V_{BB}$ is applied to the first load terminal SUP, wherein the second load terminal OUT is connected with a load (not shown), which may be connected between the load terminal OUT and ground potential. In the present example, a gate voltage $V_G$ is applied to the gate electrode of the power transistor $M_P$. The output voltage present at the output terminal OUT is denoted as $V_{OUT}$.

As mentioned, the power transistor $M_P$ is a vertical n-channel MOSFET and, therefore, the electric potential present at the drain electrode of the transistor $M_P$ is the same as the potential present in the semiconductor substrate. In other words, there is a low resistance electric connection between the load terminal SUP and the semiconductor substrate, and the substrate voltage thus equals the supply voltage $V_{BB}$.

FIG. 1 also illustrates a bipolar transistor $T_S$ (temperature sense transistor) which may be used to sense the temperature in the semiconductor body. One terminal of the bipolar transistor $T_S$ is usually electrically connected to the substrate. As any bipolar transistor, the transistor $T_S$ has a base B, a collector C and an emitter E. In the present example, the collector C of the bipolar transistor $T_S$ is connected to the substrate, and thus the supply voltage $V_{BB}$ is also applied to the collector C of the bipolar transistor $T_S$. The base-emitter diode may be used as temperature sensitive element as the forward voltage $V_{BE}$ of the base-emitter diode (when forward biased) as well as the leakage current of the base-emitter diode are temperature dependent. Therefore, the base B as well as the emitter E of the bipolar transistor $T_S$ are connected to a temperature sense circuit 40 via sense lines 81 and 82. In order to improve the performance of the temperature sensing the sense lines may be shielded using a shielding 50, which is—in the present example of a n-channel high-side switch—electrically connected to the substrate. That is, the substrate voltage (equaling the supply voltage $V_{BB}$ in the present example) is applied to the shielding. The purpose and the function of the shielding 50 will be explained later with reference to FIG. 4.

Figure 2:
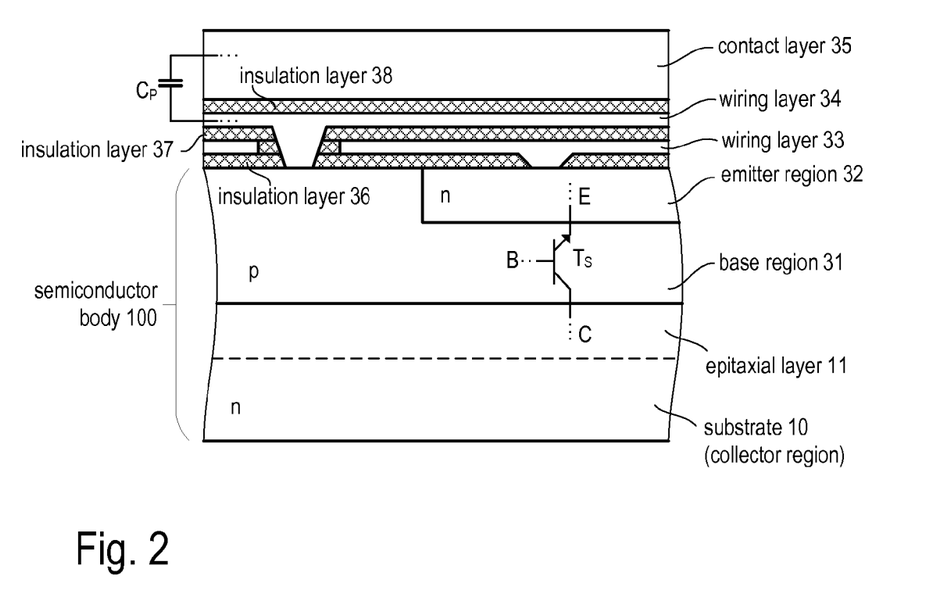
FIG. 2 is a cross-sectional view of a semiconductor die showing one example of the bipolar transistor and the wiring layers, which may be used to contact the bipolar transistor.

FIG. 2 illustrates a cross-sectional view through a portion of a semiconductor die, which is formed by a semiconductor substrate 10 (i.e. the wafer) and (optionally) an epitaxial layer 11 disposed on the substrate 10. FIG. 2 shows one example of how a bipolar transistor $T_S$ can be integrated in the semiconductor die and how this bipolar transistor may be contacted to be used as temperature sensor as shown in FIG. 1. For the further discussion the substrate 10 and the epitaxial layer, 11 (if present) are collectively referred to as semiconductor body 100. In the present example, the semiconductor body is doped with n-type dopants. A p-doped base region 31 is formed in the semiconductor body 100, e.g. using ion implantation or diffusion of dopants. The base region 31 extends from the top surface into the semiconductor body 100. Within the p-doped base region 31, an n-doped emitter region 32 is formed. The emitter region 32 (emitter well) extends from the top surface of the semiconductor body 100 into the base region 31 and is embedded therein. The n-doped region of the semiconductor body vertically below the base region 31 acts as collector region. As can be seen from FIG. 2, an npn structure (i.e. a bipolar transistor) is formed by the n-doped collector region (semiconductor body 100), the p-doped base region 31, and the n-doped emitter region 32. The collector region is formed by the n-doped portion of the semiconductor body (substrate 10 and epitaxial layer 11) and thus is at the same potential as the substrate (see also FIG. 1).

FIG. 2 further shows two wiring layers 33 and 34 disposed on the top surface of the semiconductor body 100 and isolated from the semiconductor body and from each other by insulation layers 36 and 37. Both wiring layers 33 and 34 are patterned to form strip lines and similar structures. Also the isolation layers may be patterned to form so-called vias which allow contacting the surface of the semiconductor body 100 or interconnections between the wiring layers. The lower wiring layer 33 may be formed by polycrystalline silicon (polysilicon) and isolated from the top surface of the semiconductor body 100 by insulation layer 36 (e.g. silicon oxide layer). The upper wiring layer 34 may be formed by a metal (e.g. aluminum) and isolated from the lower wiring layer 33 by insulation layer 37. In the present example, the emitter region 32 is contacted by a line in the wiring layer 33 whereas the base region 31 is contacted by a line in the wiring layer 34. On top of the wiring layers 33, 34 a comparably thick metal layer is disposed as contact layer 35, which forms a contact pad for contacting a power electrode (the source electrode of the power MOSFET $M_P$ in the present example, see also FIG. 1). The contact layer 35 is isolated from the wiring layers 33 and 34 by insulation layer 38, which may be composed of a silicon oxide layer, a silicon nitride layer, or both. The strip lines and other structures formed in the wiring layers 33 and 34 as well as the contact layer 35 are capacitively coupled. The coupling capacitances may have undesired effects and may be regarded as parasitic capacitances. FIG. 2 includes a schematic illustration of a parasitic capacitor $C_P$ between the portion of wiring layer 34, which is connected to the base of the temperature sensing transistor $T_S$, and contact layer 35.

Figure 3:
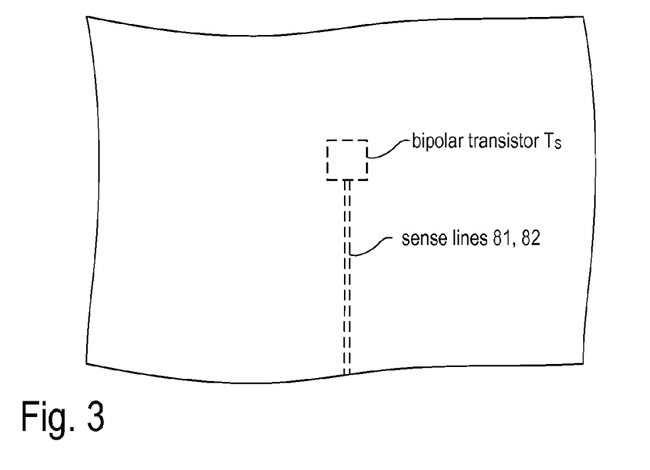
FIG. 3 is a top view of a semiconductor die illustrating the position of a temperature sensor embedded in an array of transistor cells.

FIG. 3 is a top view of a portion of the semiconductor body 100 with the metal stack (i.e. a stack of wiring layers) on top, which includes the bipolar transistor $T_S$. As mentioned above, the temperature sensor is usually included in an array of transistor cells, which compose the power MOS transistor $M_P$ (see FIG. 1). The position of the transistor $T_S$ as well as the path of the sense lines 81, 82 (cf. FIG. 1) are sketched using dashed lines. As can be seen from FIG. 3, the sense lines 81, 82, are routed through the surrounding array of transistor cells along a comparably long path of several hundred micrometers.

Figure 4:
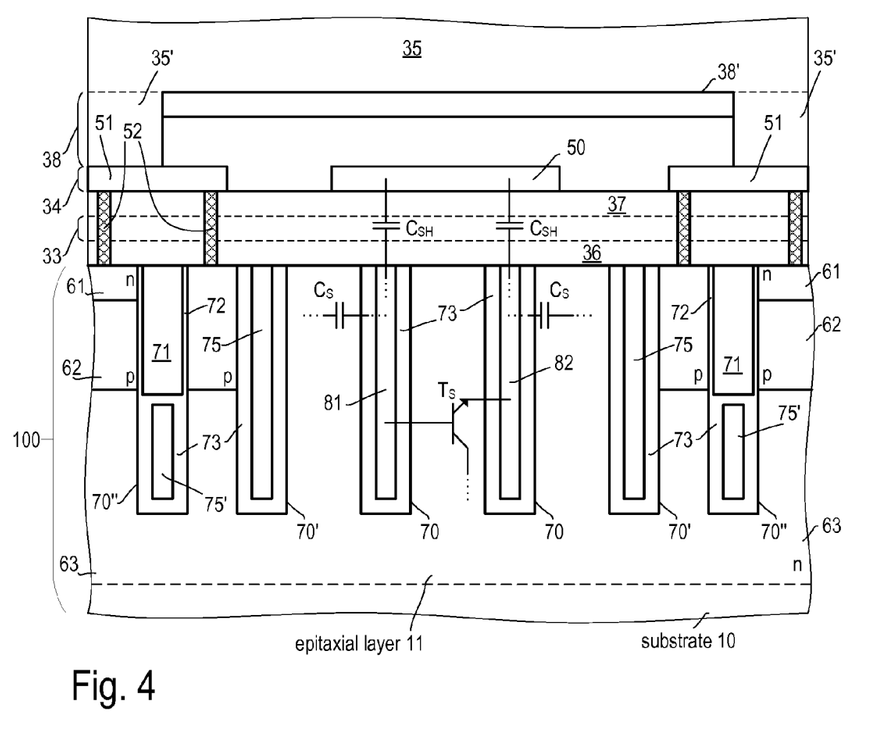
FIG. 4 is a cross-sectional view of a semiconductor die illustrating one example of how to route the sense lines through an array of transistor cells to contact a temperature sensor.

FIG. 4 is a cross-sectional view of the semiconductor body 100 shown in FIG. 3. The sectional plane of the depicted cross-section does not run through the temperature sensor (transistor $T_S$) but perpendicularly through the sense lines 81, 82 sketched in FIG. 3, which are implemented in trenches in accordance with the depicted example (and different from the previous example of FIG. 2).

Several trenches 70, 70', 70" are formed in the semiconductor body, wherein the trenches extend substantially parallel to each other in a direction perpendicular to the sectional plane of the depicted cross-section. The sense lines 81, 82 are arranged in two adjacent trenches, which are the two trenches 70 in the middle of the cross-section in FIG. 4. The sense lines 81, 82 may be formed of metal or polycrystalline silicon and are isolated from the surrounding semiconductor material by an isolation layer 73 (e.g. silicon oxide layer). Different from the example of FIG. 2, wiring layers 33 and 34 are not needed for the routing of the sense lines 81, 82. These layers can, however, be used for the wiring of other circuitry. As the sense lines 81, 82 are routed through an array of transistor cells, the trenches 70' on the left side and the right side of the sense lines 81, 82, are part of an edge termination of the power MOS transistor. That is, the trenches 70' includes field plates 75, which may be electrically connected to source potential. Such an edge termination is as such known and thus not further discussed here in more detail. The outer trenches 70" in FIG. 4 are also part of the array of transistor cells. Gate electrodes 71 are arranged in trenches 70" and isolated from the adjacent walls of the trench by gate oxide layers 72. Field plates 75' may be arranged in the trenched 70" under the gate electrodes 71. The field plates 75' are isolated from the surrounding semiconductor body 100 by an oxide layer 73 which is usually thicker than the gate oxide layer 72.

In the present example of an n-channel MOSFET, the semiconductor body 100 is doped with n-type dopants (e.g. phosphor, arsenic, antimony). So-called body regions 62, which are doped with p-type dopants (e.g. aluminum, gallium, indium, boron), are arranged in the semiconductor body 100 adjacent to the gate electrodes 71. The body regions 62 extend vertically into the semiconductor body 100 from the top surface of the semiconductor body 100, thus forming a so-called p-doped well (p-well). These p-wells may be omitted in inactive regions of the transistor. Such an inactive region is, for example, the region adjoining the trenches 70, which include the sense lines 81, 82. In active regions of the transistor, source regions 61 are embedded in the body regions 62 adjoining the trenches 71, which include the gate electrodes 71. The region 63 subjacent to the body regions 62 is referred to as drift region. At the bottom surface (not shown) of the semiconductor body 100 a drain electrode contacts the substrate 10 (which forms the drain of the power transistor).

Analogously to the previous example of FIG. 2, two wiring layers 33 and 34 are arranged on the semiconductor body 100. The wiring layer 33 is isolated from the semiconductor body by the insulation layer 36 and from the other wiring layer 34 by the insulation layer 37. Insulation layer 38 separates the contact layer 35 from the upper wiring layer 34, wherein the insulation layer 38 may be composed of two sub-layers, e.g. one oxide layer and a nitride layer 38'. In the present example, the lower wiring layer 33 (polysilicon layer) is not used to contact the transistor cells. In the present example, body regions 62 and source regions 61 are electrically connected to the upper wiring layer 34 (metal layer) by means of vias 52. The respective metal pads in the wiring layer 34 are labelled as pads 51, which are electrically connected to the contact layer 35 by means of vias 35' through the insulation layer 38.

As mentioned above, the sense lines 81, 82 are routed in two (e.g. neighboring) trenches 70. Placing the sense lines in the trenches 70 results in a strong capacitive coupling between the sense lines and the surrounding semiconductor body 100 (symbolized in FIG. 4 by capacitor $C_S$) as well as in lower (parasitic) capacitances between the contact layer 35 (see FIG. 1, terminal OUT) and the sense lines 81, 82. Particularly, when the power MOSFET $M_P$ is operated as high-side switch, the electric potential of the contact layer 35 (i.e. the source potential of the power MOSFET $M_P$) may vary rapidly between ground potential (e.g. 0 volts) and supply voltage $V_{BB}$ (see FIG. 1) due to the switching operation of the power MOSFET $M_P$. The capacitive coupling caused by the mentioned parasitic capacitances (similar to capacitance $C_P$ illustrated in FIG. 2 as well as capacitance $C_S$) forms a capacitive voltage divider and results in reduced displacement currents injected from the load current path (which includes the drain-source current path of the power MOSFET $M_P$) into the sense lines 81, 82, as compared to the planar wiring illustrated in the previous example of FIG. 2. This effect (displacement currents) caused by switching of the power transistor $M_P$ and direct power injection (DPI) due to transient, pulse-shaped disturbances may deteriorate the sensed signals as well as the measurement result obtained therefrom. To further improve the situation, at least one metal pad 50 is provided in the wiring layers 33 or 34 (or in both) between (in a vertical direction) the contact layer 35 and the trenches 70, in which the sense lines 81, 82 are routed. The metal pad 50 is connected to a constant voltage such as the supply voltage $V_{BB}$ (substrate voltage, see also FIG. 1), thus inhibiting the capacitive coupling between the sense lines 81, 82 and the contact layer 35 (output/source terminal OUT). The capacitances between the shielding 50 and the sense lines 81 and 82 are labelled $C_{SH}$ in FIG. 4.

Figure 5:
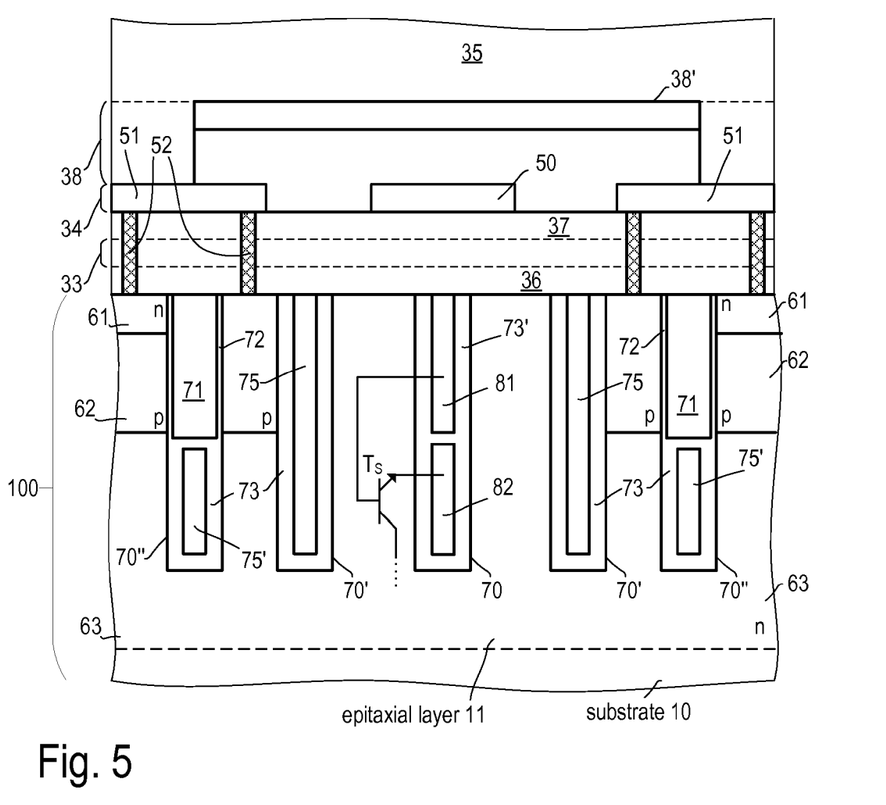
FIG. 5 is a cross-sectional view of another example of how to route the sense lines in a single trench.

In the example of FIG. 4, the two sense lines 81, 82, are routed in separate trenches 70. The capacitive coupling (capacitances $C_S$) between the sense lines 81, 82 and the substrate (which is at supply voltage $V_{BB}$ in the present example, see FIG. 1) may be tuned by appropriate adjustment of the thickness of insulation layer 73' (oxide layer), which separates the sense lines from the surrounding semiconductor body 100. The example of FIG. 5 is essentially identical to the previous example of FIG. 4 except that both sense lines 81, 82 are routed in a single trench 70, which allows to reduce the inactive area in the array of transistor cells. In the present example the sense lines 81, 82 are routed in the trench 70 one above the other. However, the sense lines 81, 82, may also be routed side by side within a single trench. Similar to the previous example the capacitive coupling between the semiconductor body 100 (at substrate voltage $V_{BB}$) and the sense lines 81, 82, may be controlled by appropriate dimensioning of the thickness of the insulation layer 73' which separates the sense lines 81 and 82 from the surrounding semiconductor body. The thickness of the insulation layer 73' may be different between sense line 81 and semiconductor body and between sense line 82 and semiconductor body. The remaining components and features of the present example of FIG. 5 have already been discussed with reference to FIG. 4 and are thus not repeated here.

Figure 6:
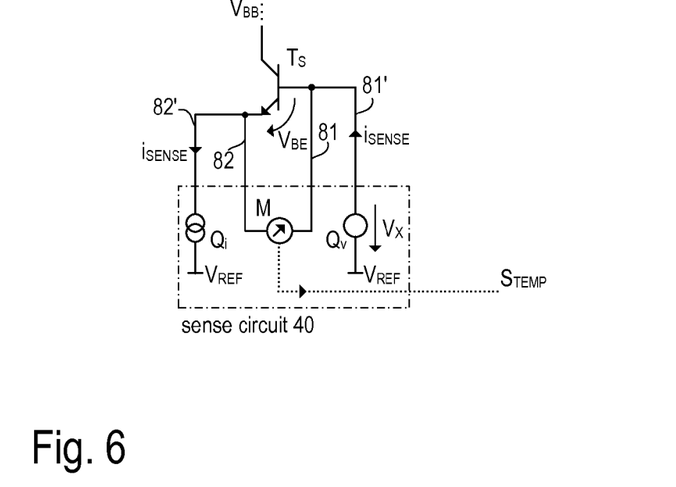
FIG. 6 is a circuit diagram illustrating the bipolar transistor and a sense circuit used to operate the bipolar transistor as temperature sensor, wherein a four-terminal sensing technique is used to obtain a signal from the temperature sensor.

FIG. 6 illustrates—similar to FIG. 1—the bipolar transistor $T_S$, which is connected to a sense circuit 40 for four-terminal sensing of temperature. According to the present example, the base-emitter diode of the bipolar transistor $T_S$ is supplied with an operating current $i_{SENSE}$ (force current) via a pair of so-called force lines 81', 82' (sensor supply lines), whereas the resulting base-emitter voltage $V_{BE}$ (i.e. the signal carrying the temperature information) is sensed via a separate pair of sense lines 81, 82. The operating current $i_{SENSE}$ (sometimes referred to as "force current") is provided by a current source $Q_i$ included in the sense circuit 40. The current source may be a stabilized constant-current source. The voltage $V_{BE}$ is sensed using separate sense lines 81, 82, which carry no (or only a negligible) current. The current source $Q_i$ may be coupled between the emitter of the bipolar transistor $T_S$ and a reference potential $V_{REF}$. However, dependent on the actual implementation, the current source $Q_i$ may also be coupled to the base of the bipolar transistor $T_S$. In the present example, a voltage source $Q_v$ (providing a voltage drop $V_X$) is coupled between the reference potential $V_{REF}$ and the base of the bipolar transistor $T_S$ in order to forward bias the base-emitter diode of transistor $T_S$. The reference potential $V_{REF}$ and the voltage $V_X$ need not necessarily be constant and are designed such to provide sufficient biasing of the base-emitter diode of transistor $T_S$. As a result, the voltage drop across the sense lines 81, 82, is zero (i.e. negligible as compared to the sensed voltage) although the sense lines 81, 82 have a significant ohmic resistance. The temperature measurement is symbolized in FIG. 6 by measurement circuit M, which receives the voltage $V_{BE}$ and derives therefrom a signal $S_{TEMP}$ representing the temperatures. Measurement circuit M may include, for example, operational amplifiers and further signal processing circuitry.

Figure 7:
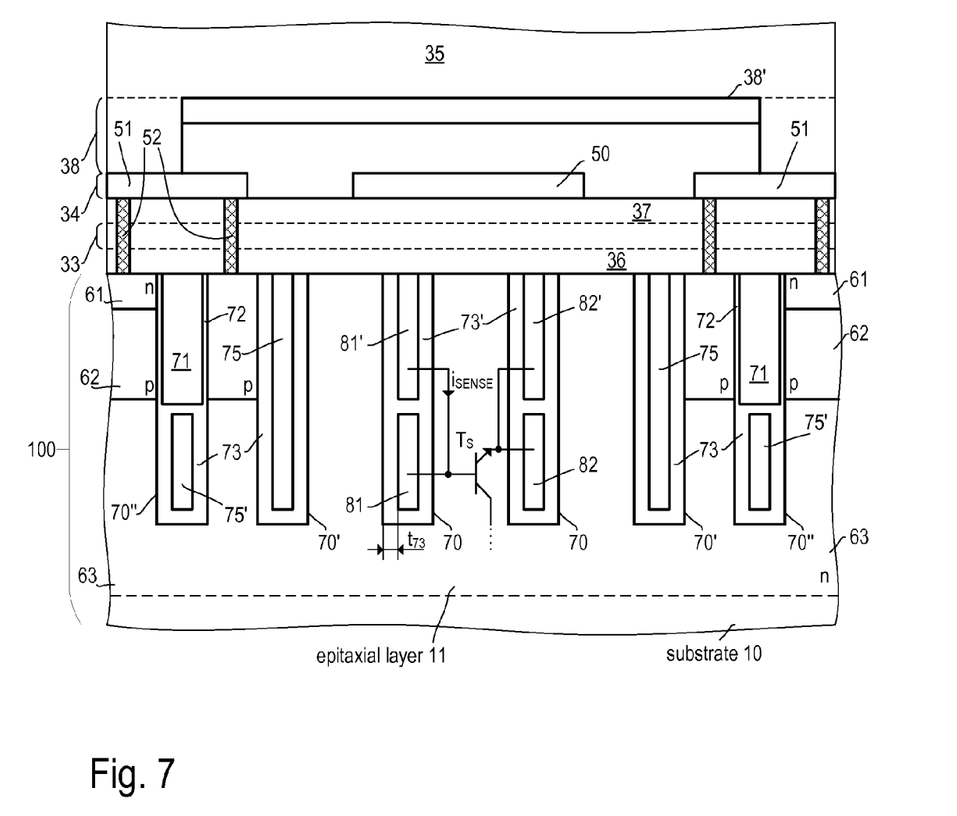
FIG. 7 is a cross-sectional view of a semiconductor die showing one example of the bipolar transistor and the wiring layers, which may be used to contact the bipolar transistor for four-terminal sensing.

FIG. 7 is a cross-sectional view of the semiconductor body 100 similar to the previous example of FIG. 4. The present example of FIG. 7 is essentially identical to the previous example of FIG. 4 except that force lines 81', 82' are routed in the trenches 70 in addition to sense lines 81, 82. In the present example, force line 81' (connected to the base of bipolar transistor $T_S$) is arranged above the corresponding sense line 81 in the same trench 70. Analogously, force line 82' (connected to the emitter of bipolar transistor $T_S$) is arranged above the corresponding sense line 82 in the neighboring trench. Similar to the previous examples, the thickness of the insulation layer 73' between the sense and force lines 81, 81', 82, 82' may be designed such that a desired capacitive coupling to the surrounding semiconductor body 100 is achieved.

Figure 8:
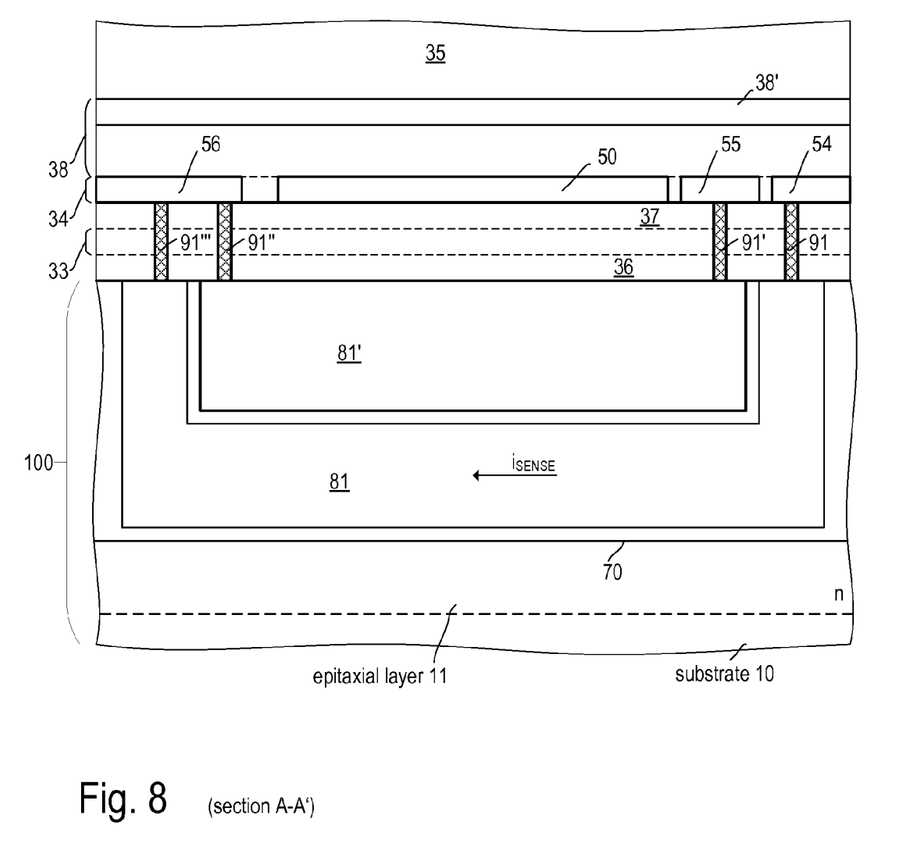
FIG. 8 illustrates a longitudinal section through a trench in which a sense line is arranged.

FIG. 8 illustrates a longitudinal section corresponding to the cross section of FIG. 7. Accordingly, FIG. 8 illustrates the trench 70, in which the sense line 81 and the corresponding force line 81' reside. At one end (right in FIG. 8) the sense line 81 and the force line 81' are electrically connected to the pads 54 and 55 formed in the wiring layer 34 by means of vias 91 and 91', respectively. At the other end (left in FIG. 9), the sense line 81 and the force line 81' are electrically connected to pad 56 formed in the wiring layer 34 by means of vias 91" and 91"'. The trench 70, the pads 54, 55, and 56, as well as the vias 91, 91', 91", and 91"' are also shown in the corresponding top view of FIG. 9, which illustrates the structure of the wiring layer 34 arranged on the semiconductor body 100 (see also FIG. 7). The contact pads 54 and 55 are wired with the sense circuit 40 (see FIG. 6) whereas the contact pad 56 is wired with the base of the bipolar transistor $T_S$. FIG. 8 also illustrates the pad 50, which shields the sense and force lines 81, 81' and inhibits a capacitive coupling between the sense and force lines 81, 81' and the contact layer 35, which is electrically connected to the source potential of the power MOSFET $M_P$. The remaining components shown in FIG. 8 are also present in the previous sectional views of FIGS. 4 and 7 and are thus not repeated here.

Figure 9:
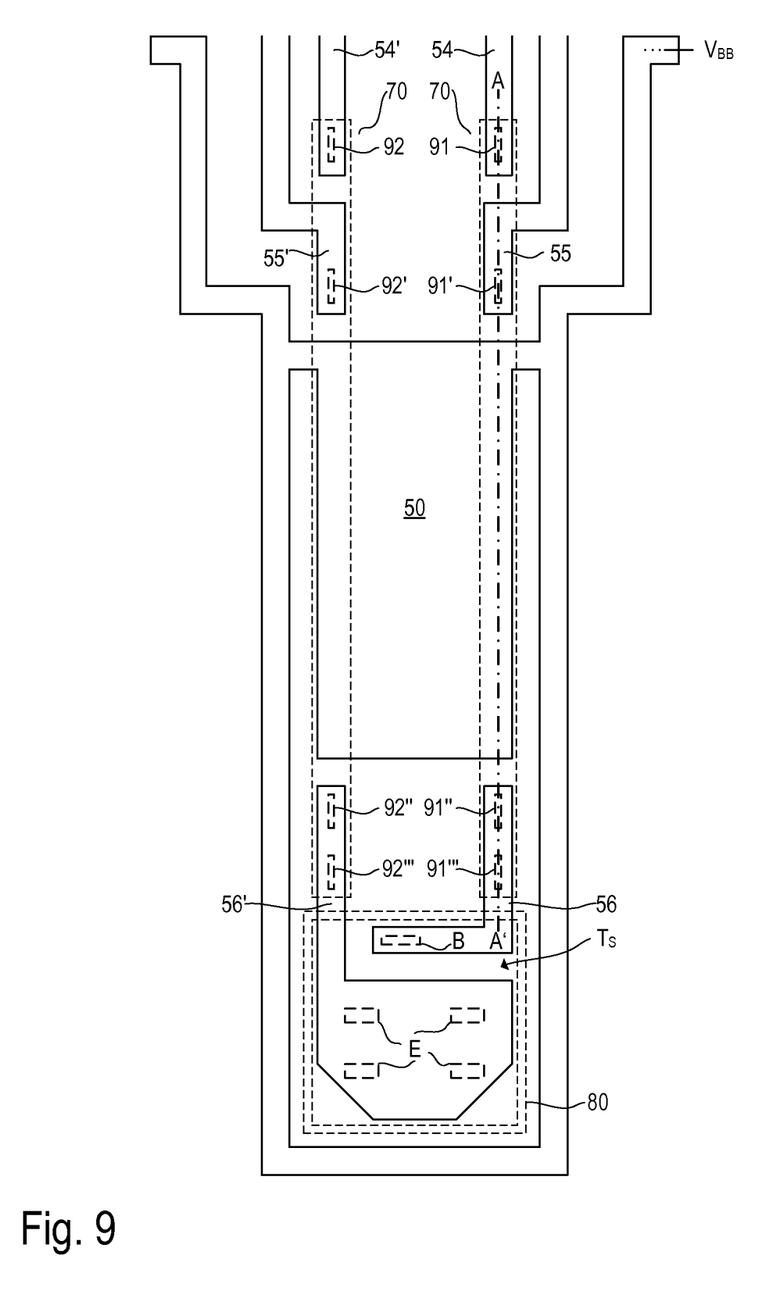
FIG. 9 is a top view illustrating the structure of a wiring layer arranged on the semiconductor body.

It is now referred to FIG. 9, which is a top view illustrating the layout of the wiring layer 34 arranged on the semiconductor body. The sectional plane A-A' defining the section of precious FIG. 8 is also depicted in FIG. 8. FIG. 9 includes (dashed lines) two adjacent trenches 70, in which the sense lines 81, 82 and the corresponding force lines 81', 82' are routed. The above-mentioned vias 91, 91', 91", and 91"' are also drawn as dashed lines, as well as the corresponding vias 92, 92', 92", and 92"' used to electrically connect the sense and force lines 82, 82' in the neighboring trench. At the bottom of FIG. 9 another trench 80 is shown, which encloses the bipolar transistor $T_S$. Further vias are used to electrically contact the emitter E and the base B of the bipolar transistor $T_S$. The contact pads 54 and 54', which are electrically connected to the sense lines 81 and 82, respectively, are routed to sense circuit 40. Analogously, the contact pads 55 and 55', which are electrically connected to the force lines 81' and 82', respectively, are also routed to sense circuit 40 as shown in FIG. 6. Contact pads 56 and 56' are electrically connected to the base B and the emitter E of the bipolar transistor $T_S$, respectively, in close proximity to the transistor $T_S$. The conductive pad 50 which form a shielding between the contact layer 35 and the sense lines 81, 82 and (if present) the force lines 81', 82' (see FIGS. 4, 5, and 7) is also shown in FIG. 9. The shielding 50 may be implemented as one single conductive pad. However, two or more separate pads may be used for the same purpose.

The examples described herein relate to a temperature sensing application, in which sense lines (e.g. lines 81, 82) connecting a temperature sensor (e.g. bipolar transistor $T_S$) and a sense circuit, which his configured to process a sensor signal tapped at the sensor, are routed through at least one trench (e.g. trench 70) and shielded by a conductive pad (e.g., shielding 50). arranged in a wiring layer (e.g., layer 34). It is understood, however, that this concept can be generalized and also applied for purposes other than temperature sensing. Generally, the temperature sensor can be regarded as a first circuit and the sense circuit can be regarded as second circuit, wherein first and second circuit are connected via connecting lines arranged in at least one trench (analogously to the sense and the force lines described with reference to the embodiments discussed herein) and shielded by a conductive pad covering the respective trench(es).

While various embodiments of the invention have been described, it will be apparent to those of ordinary skill in the art that many more embodiments and implementations are possible within the scope of the invention. Accordingly, the invention is not to be restricted except in light of the attached claims and their equivalents. With regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body;
   at least one wiring layer disposed on the semiconductor body;
   a field effect transistor integrated in the semiconductor body, the field effect transistor having a plurality of gate electrodes residing in corresponding gate trenches formed in the semiconductor body;
   a temperature sensor integrated in the semiconductor body adjacent to the field effect transistor;
   a temperature sense circuit integrated in the semiconductor body and remote from the temperature sensor;
   a first additional trench formed in the semiconductor body, the first additional trench including at least one sense line which electrically connects the temperature sensor and the temperature sense circuit; and
   at least one conductive pad formed in the at least one wiring layer, the at least one conductive pad being arranged to at least partially cover the first additional trench to form a shielding of the at least one sense line.

2. The semiconductor device of claim 1, wherein two sense lines are arranged in the first additional trench.

3. The semiconductor device of claim 1, further comprising a second additional trench in the semiconductor body, the second additional trench including at least one sense line which electrically connects the temperature sensor and the temperature sense circuit.

4. The semiconductor device of claim 3, wherein the first and the second additional trenches each include a single sense line.

5. The semiconductor device of claim 1, wherein the first additional trench includes an additional force line connecting the temperature sense circuit and the temperature sensor to supply the temperature sensor with a defined current.

6. The semiconductor device of claim 3, wherein the first and the second additional trenches each include an additional force line connecting the temperature sense circuit and the temperature sensor to supply the temperature sensor with a defined current.

7. The semiconductor device of claim 6, wherein the temperature sense circuit includes a stabilized constant current source for providing the defined current.

8. The semiconductor device of claim 1, wherein the at least one sense line connects the temperature sense circuit with the temperature sensor to apply a voltage to or to sense a voltage at the temperature sensor.

9. The semiconductor device of claim 1, further comprising a contact layer disposed on the semiconductor body so that a first wiring layer of the at least one wiring layer is between the contact layer and the semiconductor body, wherein the contact layer is electrically connected to a first load terminal of the field effect transistor.

10. The semiconductor device of claim 9, wherein the at least one conductive pad, which forms the shielding, is electrically coupled connected to a second load terminal of the field effect transistor.

11. The semiconductor device of claim 1, wherein the at least one conductive pad, which forms the shielding, is operationally coupled to a constant potential.

12. The semiconductor device of claim 1, wherein the at least one conductive pad, which forms the shielding, is electrically coupled with the semiconductor body.

13. The semiconductor device of claim 5, wherein the sense and the force lines are isolated from the surrounding semiconductor body by an insulation layer.

14. The semiconductor device of claim 13, wherein the insulation layer has a variable thickness which depends on a position in the trench.

15. The semiconductor device of claim 1, wherein the field effect transistor is composed of an array of transistor cells, each cell being associated with a gate electrode, wherein the first additional trench is routed through the array of transistor cells.

16. The semiconductor device of claim 1, wherein the temperature sensor is a diode or a base-emitter diode of a bipolar transistor.

17. The semiconductor device of claim 9, wherein the at least one wiring layer is interposed between the semiconductor body and the at least one conductive pad, wherein the at least one conductive pad is interposed between the at least one wiring layer and the contact layer, wherein the at least one conductive pad is separated from the at least one wiring layer by a first insulation layer, and wherein the at least one conductive pad is separated from the contact layer by a second insulation layer.

18. The semiconductor device of claim 9, wherein the at least one conductive pad is connected to a constant voltage so as to inhibit capacitive coupling between the at least one sense line and the contact layer.

19. The semiconductor device of claim 16, further comprising an additional sense line disposed in the same additional trench as the at least one sense line or in a different additional trench formed in the semiconductor body, wherein a base of the bipolar transistor is connected to a first one of the sense lines, and wherein an emitter of the bipolar transistor is connected to a second one of the sense lines.

* * * * *